United States Patent
Tamarkin et al.

(10) Patent No.: US 6,256,769 B1
(45) Date of Patent: Jul. 3, 2001

(54) PRINTED CIRCUIT BOARD ROUTING TECHNIQUES

(75) Inventors: Vladimir K. Tamarkin, Huntingdon Valley; Robert H. Fix, Schwenksville, both of PA (US)

(73) Assignee: Unisys Corporation, Blue Bell, PA (US)

( * ) Notice: Subject to any disclaimer, the term of this patent is extended or adjusted under 35 U.S.C. 154(b) by 0 days.

(21) Appl. No.: 09/410,269

(22) Filed: Sep. 30, 1999

(51) Int. Cl.[7] .................................................... G06F 17/50
(52) U.S. Cl. ............................................................. 716/12
(58) Field of Search ............................................. 716/6, 12

(56) References Cited

U.S. PATENT DOCUMENTS

| | | | |
|---|---|---|---|
| 3,567,914 | 3/1971 | Neese et al. | 235/151.1 |
| 4,571,451 | 2/1986 | Linsker et al. | 174/68.5 |
| 5,012,389 | 4/1991 | Perry | 361/409 |
| 5,224,022 | 6/1993 | Weigler et al. | 361/409 |
| 5,406,498 | 4/1995 | Yabe | 364/491 |
| 5,424,492 | 6/1995 | Petty et al. | 174/250 |
| 5,467,456 | 11/1995 | Moxley et al. | 364/490 |
| 5,552,567 | 9/1996 | Peterson et al. | 174/261 |
| 5,571,996 | 11/1996 | Swamy et al. | 174/261 |
| 5,629,860 | 5/1997 | Jones et al. | 364/490 |
| 5,644,500 | 7/1997 | Miura et al. | 364/490 |
| 5,663,889 | 9/1997 | Wakita | 364/490 |
| 5,682,297 | 10/1997 | Silva | 361/777 |
| 5,729,467 | 3/1998 | Katsumata et al. | 364/489 |
| 5,742,009 | 4/1998 | Hamzehdoost et al. | 174/260 |
| 5,764,485 | 6/1998 | Lebaschi | 361/774 |
| 5,784,600 * | 7/1998 | Doreswamy | 716/6 |
| 5,790,414 | 8/1998 | Okano et al. | 364/488 |
| 5,847,968 | 12/1998 | Miura et al. | 364/491 |

* cited by examiner

Primary Examiner—Matthew Smith
Assistant Examiner—Thuan Do
(74) Attorney, Agent, or Firm—Woodcock Washburn Kurtz Mackiewicz & Norris LLP (57) ABSTRACT

Apparatus and methods for defining circuit routing paths between electronic components on a substrate are disclosed. A method according to the invention includes associating one or more routing rules with connections between the components, wherein at least one of the routing rules is a minimum length routing rule; defining a first set of routing paths between the components while ignoring the minimum length routing rule; and modifying the first set of routing paths by enforcing the minimum length routing rule. Apparatus for defining circuit routing paths between components on a substrate includes a database and a routing engine that accepts the database as input. The database has an entry that includes a connection that is represented by a signal traveling between a start point and an end point on the substrate, and a set of routing rules associated with the connection. The set of routing rules includes at least a minimum length routing rule. The routing engine defines a first routing path from the start point to the end point that provides information necessary to establish the connection, while ignoring the minimum length routing rule associated with the connection. The routing engine then enforces the minimum length routing rule by increasing the length of the first routing path to define a modified routing path.

17 Claims, 5 Drawing Sheets

PRINTED CIRCUIT BOARD ROUTING TECHNIQUES

FIELD OF THE INVENTION

This invention relates to printed circuit board routing techniques. More particularly, the invention relates to apparatus and methods for defining circuit routing paths between electronic components on a substrate by varying the effect of minimum length routing rules.

BACKGROUND OF THE INVENTION

Routing is a process used to define certain paths between various electronic components on a substrate such as a printed circuit board (PCB). The routing process results in a routing pattern that, when etched onto a printed circuit board as a pattern of traces, provides the required electrical connectivity between the components. Typically, during PCB fabrication, copper traces or other copper features are developed on copper foils by chemical etching and plating processes. The copper foils are then laminated to dielectric materials to form the PCB.

PCB complexity ranges from simple, one-layer boards to high density, multilayer boards. A multilayer board can be a dense, 3-dimensional maze of copper traces and copper plated holes. For these boards, powerful computers and sophisticated routing software must be used to be able to accomplish a routing task. Companies that specialize in developing routing software, or "routing engines," continue to enhance existing routing algorithms to handle higher density PCB designs. Occasionally, however, board designers that use existing routing software have to develop new routing techniques to achieve a desired result using an existing routing engine.

Automatic routing techniques are commonly used to define a routing pattern for a system of electronic components on a substrate. The routing pattern, which comprises a plurality of routing paths that have been defined between pins of various components, is used to establish the electrical connections between the various components on the substrate. Typically, a goal of an automatic routing technique is to determine the most efficient routing pattern for the system, given certain constraints or "routing rules."

In timing critical circuit designs, board routing must comply with strict routing rules such as minimum length, maximum length, and matched length rules to ensure proper timing of a corresponding electronic circuit. Thus, if the length of a routing path defined between two electronic components is shorter than required, the routing path must be lengthened to comply with the applicable routing rules. An automatic routing engine usually adds this extra length in the form of a serpentine pattern.

Well known software packages are widely used to define routing patterns during the PCB design process. These routing engines, however, can be inadequate for routing near areas on the PCB where the routing density is high. An application specific integrated circuit (ASIC), for example, typically communicates with numerous electrical components the PCB and, consequently, requires a large number of traces.

The minimum required path length between two electrical components is determined based on, among other things, the signal delay required between the components. Typically, when the so-called "Manhattan" route (ie., where the path is routed along an x-y grid) does not provide sufficient delay, a "serpentine" pattern is added in the path. Existing routing engines have proven incapable of providing proper routing in regions of high routing density because the serpentine patterns quickly exhaust the available space on the PCB in the vicinity of the component before all of the paths can be defined. Consequently, the routing pattern cannot be defined.

Other high pin count electronic components, such as pin grid arrays (PGAs) and ball grid arrays (BGAs), also create high route density areas on PCBs since a significant number of traces must enter or exit the wiring area surrounding the high pin count device(s). Since there is a finite number of routing channels available through the area, multiple routing layers may be required to complete the routing path. Obviously, this increases board complexity and cost While routing channels are already at a premium in high density areas, serpentines may additionally reduce the available routing space by blocking the routing channels. This can make the board unroutable or may necessitate additional layers.

Thus, it would be advantageous to PCB designers engaged in the process of board routing to have an automatic routing technique that improves board routability, reduces the number of copper layers needed to route a board, and reduces the time necessary to complete the routing process, by eliminating the blockage of routing channels in high density wiring areas by serpentine traces.

SUMMARY OF THE INVENTION

The present invention satisfies these needs in the art by providing apparatus and methods for defining circuit routing paths between electronic components on a substrate. In a typical implementation, the invention can be embodied as a software product carried on a computer-readable medium, such as a magnetic or optical disk, memory device, or even a computer network (ie., the software product could be distributed over the Internet). Alternatively, the invention can be practiced by using conventional routing engine software in a new way, in accordance with the methods described below.

A method for defining routing paths between components on a substrate, such as a printed circuit board, includes associating one or more routing rules with connections between the components. At least one of the routing rules can be a minimum length routing rule. A first set of routing paths between the components is defined while ignoring the minimum length routing rule. Then, the first set of routing paths is modified by enforcing the minimum length routing rule.

Preferably, the modified set of routing paths is defined based on the first set of routing paths. Each routing path in the modified set of routing paths corresponds to a respective routing path in the first set of routing paths. At least one of the routing paths in the modified set of routing paths is longer than the corresponding routing path in the first set of routing paths, having been defined by adding at least one serpentine pattern to the corresponding routing path in the first set.

In one aspect of the invention, the first set of routing paths is defined by assigning a relatively low priority to the minimum length routing rule, and then executing a routing engine in a first mode that ignores the minimum length routing rules based on the relatively low priority. The modified set of routing paths is then defined by assigning a relatively high priority to the minimum length routing rules, and executing the routing engine in a second mode that considers the minimum length routing rules based on the relatively high priority.

Apparatus for defining circuit routing paths between components on a substrate comprises a database and a routing engine. The database has an entry that includes a start point, an end point, and a set of routing rules. The set of routing rules can include at least one minimum length routing rule. The routing engine accepts the database as input and, based thereon, defines a first routing path from the start point to the end point. The first routing path is defined while ignoring the minimum length routing rule. Then, the routing engine enforces the minimum length routing rule by increasing the length of the first routing path to define a modified routing path. The apparatus can also include a user interface coupled to the database and the routing engine via which a user can define at least one of the routing rules and at least one of the first or second routing paths.

Other aspects of the present invention are described below.

BRIEF DESCRIPTION OF THE DRAWINGS

The foregoing summary, as well as the following detailed description of the preferred embodiments, is better understood when read in conjunction with the appended drawings. For the purpose of illustrating the invention, there is shown in the drawings an embodiment that is presently preferred, it being understood, however, that the invention is not limited to the specific apparatus and methods disclosed. In the drawings.

DETAILED DESCRIPTION OF PREFERRED EMBODIMENTS

Overview

In a preferred embodiment of the invention, a known routing engine can be used to define circuit routing paths between electrical components on a substrate. The substrate can be a printed circuit board (PCB), for example, and can have a single layer or multiple layers. According to an embodiment of the invention, a relational database is generated (e.g, in ASCII) that includes a reference to each of the electrical components, along with a set of routing rules that define the requirements (e.g., delay requirements) for routing between components. The database is then modified to remove, or to reduce the priority of, certain minimum length routing rules (e.g., by setting the required minimum length to an insignificant or negative number). The routing engine is executed, using the modified database as input, to define a first set of routing paths that provides the required connections between the components. This first set of routing paths is defined without considering the true minimum length rules (and thus avoiding the need for serpentine patterns in the first set of routing paths). After the first set of routing paths is defined to provide the required connections, the database is returned to its original state, including the required minimum length rules. The routing engine is executed again to modify the routing pattern to satisfy the minimum length rules. Thus, this technique enables the routing engine to make use of any space available on the substrate, after all of the required connections have been established, to place the required serpentines.

The invention can be carried out by using a known routing engine in a new way, i.e., by providing "false" minimum length rules in an initial run to ensure that the desired connections are established before enforcing the "true" minimum length rules. Alternatively, the invention can be implemented as a new routing engine software product that automatically carries out the inventive process of first establishing the desired component interconnections before enforcing the minimum length rules.

Conventional PCB Design and Automatic Routing Techniques

A conventional single layer PCB comprises a layer of copper bonded to a dielectric substrate. The dielectric material used to form the substrate is typically a plastic resin with glass fibers. A well-known dielectric used for printed circuit boards is "FR4." A two-layer PCB comprises a layer of copper bonded to each side of a dielectric substrate. A multilayer PCB comprises a plurality of two-layer boards laminated together. To laminate the layers of the multilayer board together, the two-layer boards are stacked alternatively with layers of a dielectric material that has not been fully cured. Then, the dielectric is allowed to cure fully, thus forming the multilayer board.

After the copper layers have been laminated to the dielectric layers, through holes are drilled through the boards. A subsequent plating process then causes additional copper to be deposited onto the surfaces, as well as in the through holes. Thus, the through holes provide connectivity vertically through board (like an elevator). An etching process is then employed to form a routing pattern on each layer of the board. The routing pattern is typically formed by the etching away of copper that is not part of the routing pattern. Copper dots or "pads" are also allowed to remain to indicate where on the board electrical components are to be inserted or soldered.

Typically, the routing pattern that is formed on the board during manufacture, has been designed through the use of an automatic routing technique that defines the routing paths between the electrical components that will be mounted on the board. Many automatic routing techniques are well known in the art. Two of these, which are commonly referred to as the "line search" method and the "maze" method, will now be described in detail.

In the line search method, a routing path between pins of electrical components on a PCB is determined according to the following procedure. First, a straight line, known as a "first probe line" is drawn in a suitable direction from a first or "start" point or pin, toward a second or "end" point within a wiring area on the substrate. If the first probe line does not reach the end point, a second probe line is drawn toward the end point from a suitable position on the first probe line and at right angles thereto. This process continues until the $n^{th}$ probe line reaches the end point. Thus, a routing path is defined between the start point and the end point.

Figure 1:
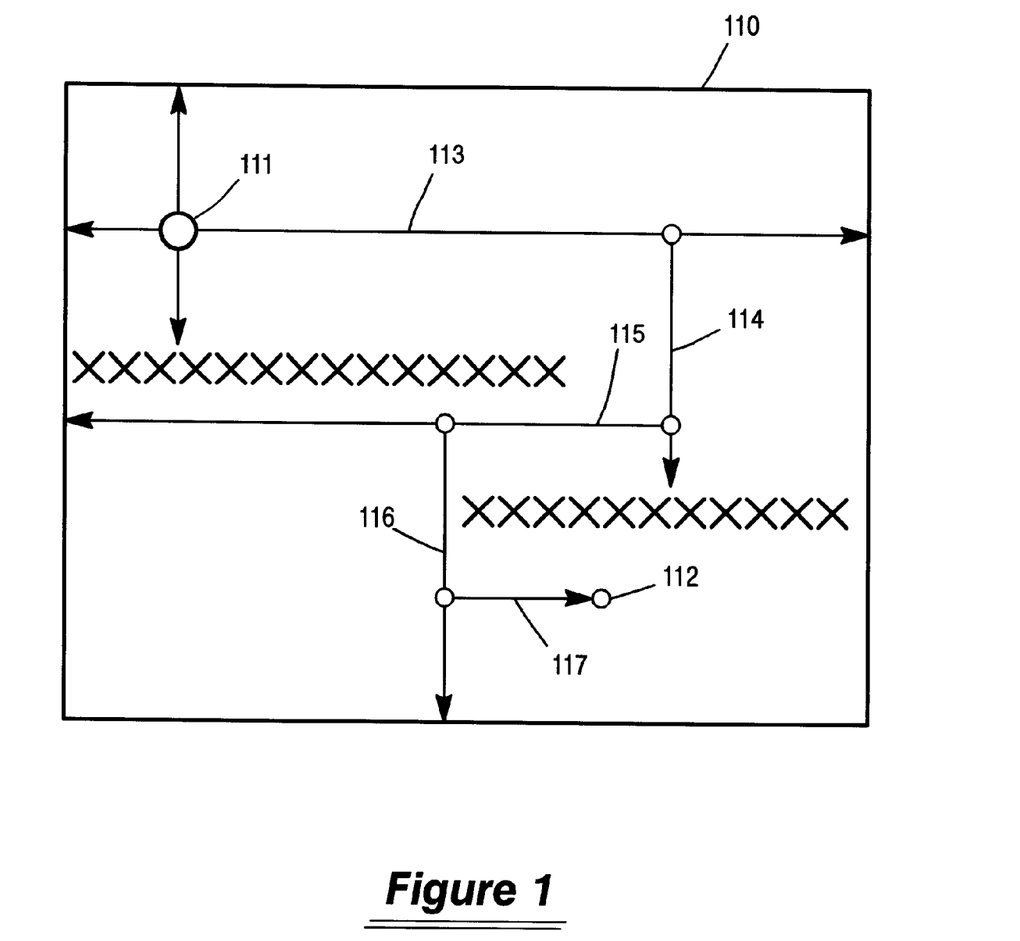
FIG. 1 shows an example of a circuit routing path defined between electronic components on a substrate using the line search method.

FIG. 1 shows an example of a circuit routing path defined between electronic components on a substrate 110 (e.g., a printed circuit board) using the line search method. Initially, two points to be interconnected via the routing path are selected as a start point (e.g., pin) 111 and an end point (e.g., pin) 112. Then, a routing path from start point 111 to end point 112 is determined in the following manner.

First, an appropriate direction to approach end point 112 from start point 111 is determined on printed circuit board 110, and a first probe line 113 is drawn from start point 111 in that direction (ie., to the right as shown in FIG. 1). In this example, first probe line 113 cannot reach end point 112, so a second probe line 114 is drawn in an appropriate direction at right angles to first probe line 113 in the direction of end point 112 (i.e., downward in the example shown in FIG. 1).

As shown, second probe line 114 cannot reach end point 112 because of a routing prohibited region (e.g., a component). Routing prohibited regions are designated by "X" marks in FIG. 1. A third probe line 115 at right angles to second probe line 114, a fourth probe line 116 at right angles to third probe line 115, and a fifth probe line 117 at right angles to fourth probe line 116, are successively drawn from appropriate departure points on the immediately preceding probe lines, in the same manner. Finally, fifth probe line 117 reaches end point 112. Thus, probe lines 111–117 define a routing path from start point 111 to end point 112 on substrate 110.

In the maze method, a routing path is defined as follows. A plurality of "meshes" are defined within the wiring area of the substrate. A "search wave" is then generated from a start point toward an end point. A route on which the search wave has traveled is stored in the order of mesh units. When the wave reaches the end point, positions of stored meshes through which the wave has passed are traced back to determine the routing path.

Figure 2:
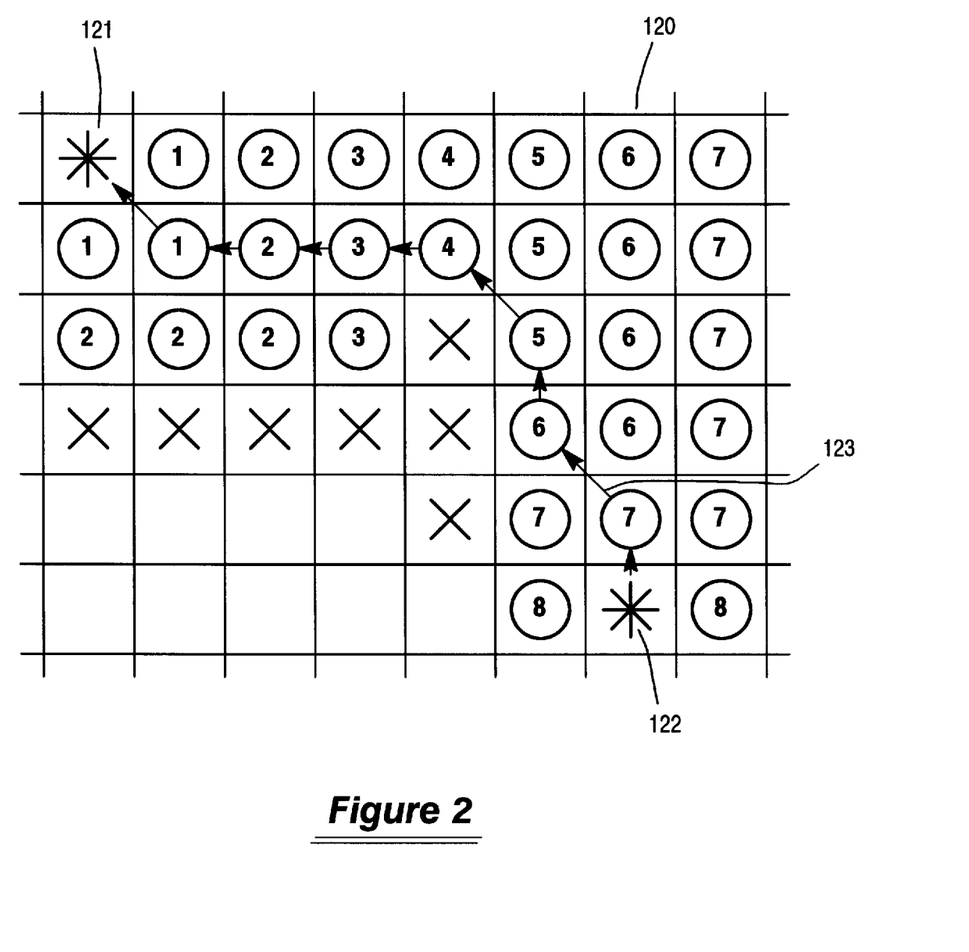
FIG. 2 shows an example of a circuit routing path defined between electronic components on a substrate using the maze method.

FIG. 2 shows an example of a circuit routing path defined between electronic components on a substrate 120 (e.g., printed circuit board) using the maze method. Initially, two points to be interconnected via the routing path are selected as a start point (e.g., pin) 121 and an end point (e.g., pin) 122. To define the wiring pattern or routing path from start point 121 to end point 122, a plurality of meshes are defined on substrate 120. A search wave is then generated and propagated from start point 121 toward end point 122 in the following manner.

Meshes adjacent to the mesh in which start point 121 is located are labeled (1). Similarly, meshes adjacent to meshes labeled (1) are labeled (2), meshes adjacent to meshes labeled (2) are labeled (3), and so on. Meshes labeled (X) represent a routing prohibited region (e.g., a component). The meshes are labeled successively in the same manner until the routing path reaches from start point 121 to end point 122. In the example shown in FIG. 2, the mesh in which end point 122 is located is the eighth mesh counted from start point 121. As the search wave propagates, the positions of the meshes through which the search wave passes are stored. To determine the routing pattern, the positions of the meshes through which the wave has passed are traced back from end point 122 to start point 121.

Apparatus and Methods for Defining Routing Paths

Figure 3:
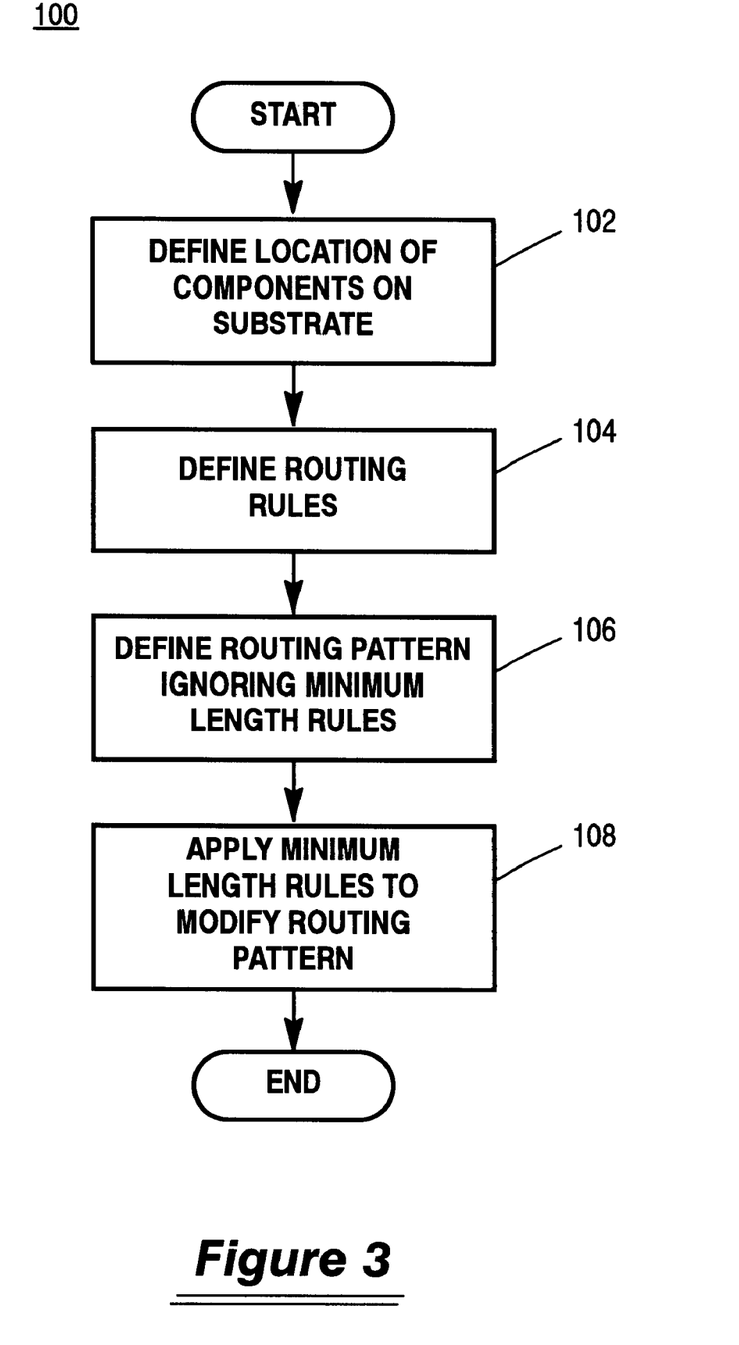
FIG. 3 is a flowchart of a preferred embodiment of a method according to the present invention for defining circuit routing paths between electronic components on a substrate.

FIG. 3 is a flowchart of a preferred embodiment of a method 100 according to the present invention for defining circuit routing paths between electronic components on a substrate, such as a printed circuit board.

At step 102, the location of the components on the substrate is defined. Basically, the substrate is modeled as an X-Y grid. Then, for each component on the substrate, the component's location can be represented by the x-y coordinates that define the area that the component occupies on the substrate. There are several known software packages that can be used to "place" the components on the substrate (i.e., to define the location of each component on the substrate), or the components can be placed manually.

Once the components have been placed on the substrate, a routing engine can be employed to define the routing pattern either manually or automatically. Typical routing engines can be executed in either an automatic mode, where the routing engine accepts a database as input and defines routing paths based thereon, or in a manual mode, where the user can define routing paths via a user interface coupled to the routing engine.

The input database typically includes a set of routing rules associated with each of the predefined connections between the components. Thus, at step 104, a set of one or more routing rules is defined. Typically, the user specifies the routing rules via a user interface coupled to the database. It should be understood that the routing rules can be based on, among other things, the type of dielectric used. It is known, for example, that signals travel at different rates depending on the dielectric used. For "FR4," a well-known dielectric used for printed circuit boards, signals travel at about 42 ns/inch along the traces.

The set of routing rules can include minimum length routing rules, maximum length routing rules, matched length routing rules, and so on. Preferably, a relational database is generated that includes information necessary to define the routing pattern on the substrate. It should be understood that the database could be generated manually, or with the aid of other software packages developed especially to perform this function. In a preferred embodiment of the database, a connection is represented by data that describes a signal traveling between certain pins of certain electrical components. For simplicity, each signal is typically given a name.

A typical database entry might include, for example, the signal name, the start and end pins, and the minimum and maximum lengths that a path between the start pin and end pin can have to meet the required timing for that signal. Other circuit rules can regulate the proximity of traces to one another (on the same or different layers) to prevent crosstalk, the direction of traces on different layers to prevent so-called "wrong-way etch," (e.g., a vertical etch on a horizontal layer, or vice versa), trace width (to control impedance), etc.

There are several ways to define routing rules that control timing by regulating the length of a routing path defined between certain pins. A minimum length routing rule, for example, can be represented in the database by an entry that includes the signal name, start pin, end pin, and the minimum required length of a routing path between the start and end points. Similarly, a maximum length routing rule can be represented in the database by an entry that includes the signal name, start pin, end pin, and the maximum allowable length of a routing path between the start and end points. Where both minimum and maximum routing rules exist for a certain connection, any routing path between the start pin and the end pin must be at least as long as the minimum length, but may not exceed the maximum length.

In certain circumstances, minimum and maximum length rules are insufficient to properly characterize the timing requirements, such as in the case of a bus. Typical buses comprise a plurality of lines that are related to one another in terms of timing. Each individual line typically has its own minimum and maximum routing rules; however, these lines also must be "matched." That is, so-called "matched length" routing rules are applied to all the related lines (e.g., all the lines on the bus), to ensure that the timing of each related line is within a certain predefined tolerance of every other related line. For example, a matched length routing rule might require that all the lines on a certain bus must be within a certain length of each other. Typically, the Manhattan length for some lines will be longer than for others. Consequently, length usually must be added to the shorter lines. In this way, matched length rules function as an additional set of minimum length rules.

Once the database has been generated, a routing engine can use the database, with all the routing rules defined therein, to define the routing paths between the components on the substrate. Typically, the routing engine attempts to define one routing path at a time. If it is unable to define a particular routing path on a first pass, however, it typically will skip the path it is unable to define, and move on to the next path. Once it has completed this first pass, it makes a second pass through the connections and, using the routing pattern defined in the first pass, it attempts to define the remaining paths. It will continue to make passes through the connections until all paths have been defined subject to the corresponding routing rules.

Typically, the routing engine will assign priorities to the routing rules. For example, on a first pass the routing engine might assign a higher priority to establishing the connections than it does to minimizing the number of cross-overs. That is, the priority of the cross-over rules is lower relative to the priority of establishing the connections. In this case, the routing engine will define a first set of routing paths (i.e., a first routing pattern), ignoring any cross-over routing rules. On the second pass, the routing engine starts with the routing pattern defined on the first pass, but now tries to reduce the number of cross-overs. The engine typically accomplishes this by increasing the relative priority of the cross-over routing rules on the second pass.

It has been found, however, that routing engines often are unable to define all the routing paths coming into and out of high density areas on the substrate. High density areas are those areas on the substrate with many pins or where many connections need to be established. The density in these areas is often referred to as a "pocket density." Obviously, if the routing paths in a high density area cannot be defined, then the routing pattern for the substrate as a whole cannot be defined. In this way, the pocket density drives the board density.

Figure 4:
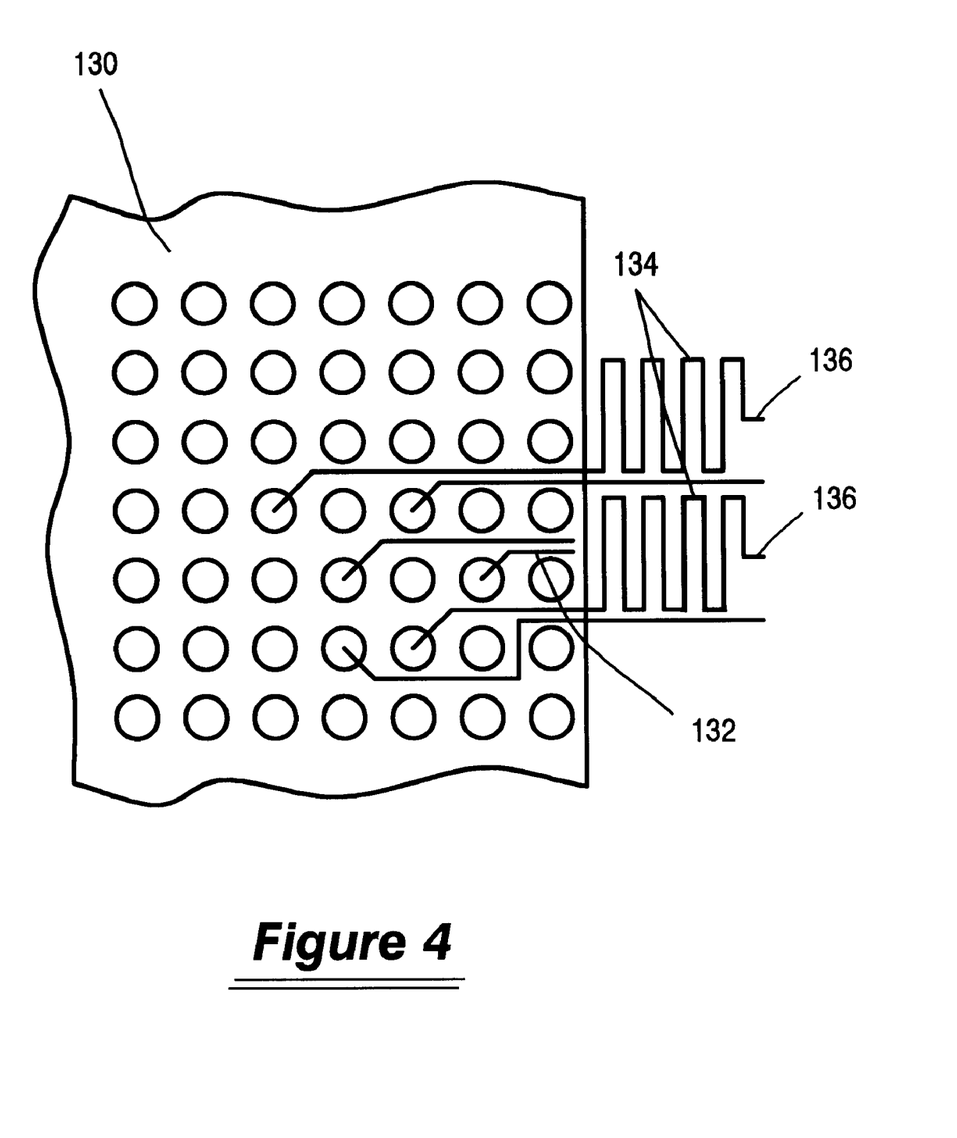
FIG. 4 depicts a high density area on a substrate with routing paths blocked by serpentine patterns.

Typically, as the routing engine attempts to define one routing path at a time, it adds serpentine patterns where necessary to meet minimum length routing rules. Sometimes, the serpentines defined to lengthen the earlier-defined routing paths can block the "escape routes" for other, later-defined paths that need to get into or out of the high density area. Frequently, the routing engine gets "stuck," ie., it simply cannot complete the routing pattern. FIG. 4 depicts a high density area on a substrate 130 with later-defined routing paths 132 being blocked by serpentine patterns 134 that were added to earlier-defined routing paths 136.

To minimize the negative effect that a serpentine pattern has on routing in high-density areas, a routing method can be deployed wherein the addition of serpentine patterns is delayed until after all connections are established. To accomplish this, the serpentine function can be "disabled" during initial routing passes, thus maximizing the availability of routing paths in high density areas. The serpentine function can be disabled in a number of ways, such as by ignoring minimum length rules, varying the relative priority of the minimum length rules, or by modifying the database to produce artificially small minimum length rules. Typically, minimum length rules are given relatively high priority on all passes, and the inventors know of no routing engine that allows for varying the priority of the minimum length rules.

Preferably, maximum length rules are applied during the initial passes because it is usually more difficult to shorten overly long routing paths than it is to lengthen overly short routing paths. Sometimes, a shorter length than the Manhattan length is needed (e g., for timing or cost control). In this case, the routing path can be defined on a diagonal (e.g., in an x-y coordinate system imagined on the substrate). Some known routing engines diagonalize routing paths automatically; others require that this be done manually.

Thus, as shown in FIG. 3 at step 106, a first set of routing paths is defined in the absence of the "true" minimum length rules. Preferably, the first set of routing paths between the electrical components is defined by executing a routing engine in a first mode wherein the routing engine "ignores" the minimum length routing rules. The routing engine can be made to ignore the minimum length rules in a number of ways. For example, the routing engine can be made to assign a relatively low priority to the minimum length rules. The engine thus "ignores" the minimum length routing rules while defining the first set of routing paths by virtue of their relatively low priority. Since there are no minimum length requirements, the routing engine does not generate any serpentine patterns. This allows easier escape from high density areas. It should be understood that the routing engine can also complete the routing task more quickly and efficiently because it is not required to consider as many routing rules.

In a preferred embodiment of the present invention, a routing engine can be implemented as a software package that effectively ignores the minimum length rules while defining a first set of routing paths by assigning a relatively low priority to the minimum length rules. The invention can also be implemented by using an existing routing engine that does not provide for varying the relative priority of the minimum length rules. In this case, the priority can be varied by modifying the minimum length rules in the database. For example, the database can be edited to set the minimum length effectively to zero. The minimum lengths can be set actually to zero, although it is preferred that the minimum lengths are set to a negative number or a very small positive number (i.e., very small compared to the required minimum length).

Figure 5:
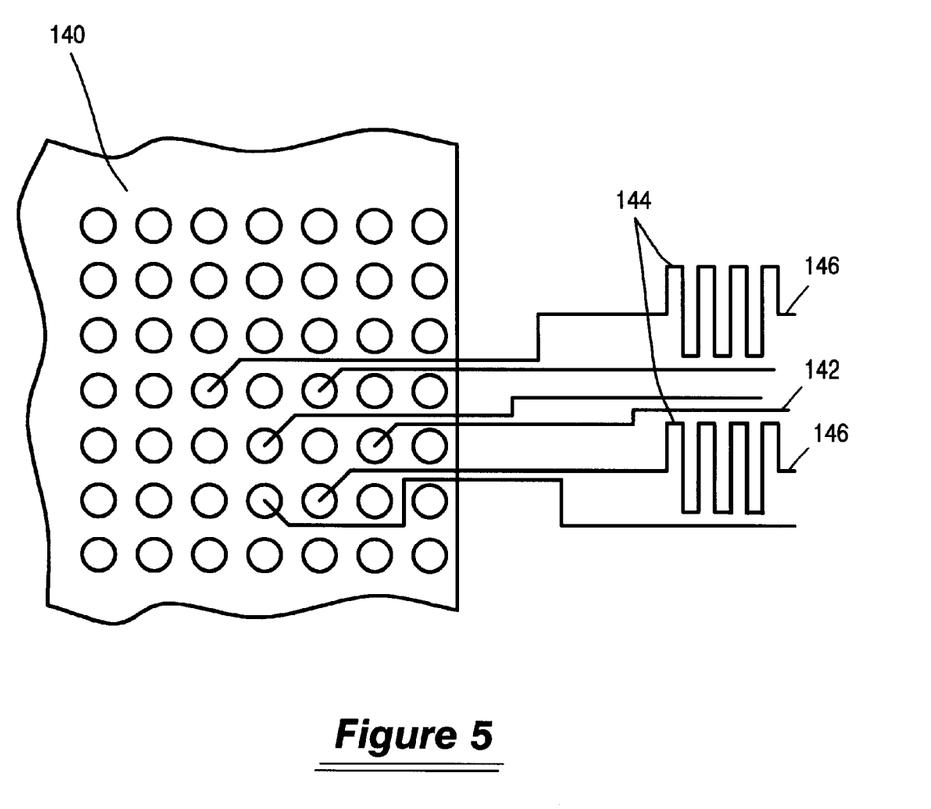
FIG. 5 depicts a routing pattern in a high density area on a substrate with serpentine patterns located in low density areas.

After the first set of routing paths has been defined in the absence of the minimum length rules, a modified set of routing paths is defined, at step 108. At this stage, an automatic routing engine, specialized post routers, or a manual route can be used to adjust the lengths of any overly short routing paths to comply with the minimum and matched length rules associated with those paths. To accomplish this, serpentine patterns can now be added in lower density areas on the substrate, or wherever space is available. FIG. 5 depicts a routing pattern in a high density area on a substrate 140 with serpentine patterns 144 located in low density areas. In this case, earlier-defined routing paths 146 do not block the escape for later-defined routing paths 142.

Preferably, the modified set of routing paths between the electrical components is defined by executing the routing engine in a second mode wherein the routing engine considers the "true" minimum length routing rules. In a preferred embodiment, defining the modified set of routing paths comprises assigning a relatively high priority to the minimum length rules, and then executing the routing engine in a second mode wherein the minimum length routing rules are considered based on the relatively high priority. This can also be accomplished by editing the database to restore the minimum lengths to their "true" values, and then executing the routing engine using the restored database as input.

Preferably, the modified set of routing paths is defined based on the first set of routing paths, with each routing path in the modified set corresponding to a respective routing path in the first set. That is, the modified set of routing paths can be defined by starting with the first set of routing paths and adjusting the length of any routing path in the first set that does not comply with its associated minimum or matched length rules. Thus, at least one routing path in the modified set will be longer than the corresponding routing path in the first set. As discussed in detail above, in defining the modified set of routing paths, routing paths that need to be lengthened are preferably defined by adding one or more serpentine patterns to the corresponding routing path in the first set.

Thus, the first set of routing paths provides the information necessary to establish the required connections between the components on the substrate. The routing engine can then determine what space is available on the substrate for the addition of serpentine patterns, if necessary, to define the modified set of routing paths to comply with the minimum length routing rules. Significantly, after the first set of routing paths has been defined, any required serpentine patterns can be placed in any space available on the substrate. It should be understood that a serpentine pattern has no specific form, and that the actual form of the serpentine can depend on the geometry of the available space.

Those skilled in the art will appreciate that numerous changes and modifications may be made to the preferred embodiments of the invention and that such changes and modifications may be made without departing from the spirit of the invention. For example, the methods of the invention can be embedded into the routing engine software, thus making the route strategy transparent to an end user, yet improving efficiency and, therefore, the competitiveness of the routing engine. It also can be implemented as a process for using an existing routing engine, allowing the end user to optimize board designs and to deliver routing solutions more efficiently. It is therefore intended that the appended claims cover all such equivalent variations as fall within the true spirit and scope of the invention.

We claim:

1. A method for defining routing paths between electrical components on a substrate, comprising:
    associating a set of one or more routing rules with connections between the electrical components, wherein at least one of the routing rules is a minimum length routing rule;
    defining, based on a subset of the routing rules, a first set of routing paths between the electrical components, wherein the subset does not include the minimum length routing rule; and
    defining a modified set of routing paths by modifying the first set of routing paths based on the set of routing rules including the minimum length routing rule, wherein at least one of the routing paths in the modified set of routing paths is defined by adding at least one serpentine to a corresponding routing path in the first set of routing path.

2. The method of claim 1, wherein the modified set of routing paths is defined based on the first set of routing paths.

3. The method of claim 2, wherein each routing path in the modified set of routing paths corresponds to a respective routing path in the first set of routing paths.

4. The method of claim 3, wherein at least one of the routing paths in the modified set of routing paths is longer than the corresponding routing path in the first set of routing paths.

5. The method of claim 4, wherein at least one of the routing paths in the modified set of routing paths is defined by adding at least one serpentine to the corresponding routing path in the first set of routing paths.

6. The method of claim 1, wherein the method is for defining circuit routing paths between electronic components on a printed circuit board.

7. The method of claim 1, wherein defining the first set of routing paths comprises assigning a relative priority to each of the routing rules, wherein the minimum length routing rule is assigned a relatively low priority, the method further comprising:
    defining the subset based on the relative priorities of the routing rules such that the minimum length routing rule is not included in the subset.

8. The method of claim 7, wherein defining the modified set of routing paths comprises assigning a relatively high priority to the minimum length routing rule.

9. Apparatus for defining circuit routing paths between electrical components on a substrate, comprising:
    a database having an entry that includes a start point and an end point on the substrate, and a set of routing rules associated with a routing from the start point to the end point, the set of routing rules including at least a minimum length routing rule; and
    a routing processor that accepts the database as input and, based thereon,
    defines a first routing path from the start point to the end point that has a length and is based on a subset of the routing rules that does not include the minimum length routing rule,
    and then defines a modified routing path based an the first routing path and the minimum length routing rule, wherein the modified routing path is defined by adding at least one serpentine to the first routing path.

10. The apparatus of claim 9, further comprising:
    a user interface coupled to the database via which a user can define at least one of the routing rules.

11. The apparatus of claim 9, further comprising:
    a user interface coupled to the routing processor via which a user can define at least one of the first or modified routing paths.

12. The apparatus of claim 9, wherein the minimum length routing rule is represented by a database entry that includes a signal name, the start point, the end point, and a minimum required length of a routing path between the start and end points.

13. A computer-readable medium having stored thereon computer-executable instructions for performing a method for defining routing paths between electrical components on a substrate, the method comprising:
    associating a set of one or more routing rules with connections between the clerical components, wherein at least one of the routing rules is a minimum length routing rule;
    defining, based on a subset of the routing rules, a first set of routing paths between the electrical components, wherein the subset does not include the minimum length routing rule; and
    defining a modified set of routing paths by modifying the first set of routing paths based on the set of routing rules including the minimum length routing rule, wherein at least one of the routing paths in the modified set of routing paths is defined by adding at least one serpentine to a corresponding routing path in the first set of routing paths.

14. The computer-readable medium of claim 13, having stored thereon computer-executable instructions for defining the modified set of routing paths based on the first set of routing paths.

15. The computer-readable medium of claim 14, having stored thereon computer-executable instructions for defining the modified set of routing paths such that each routing path in the modified set of routing paths corresponds to a respective routing path in the first set of routing paths.

16. The computer-readable medium of claim 14, having stored thereon computer-executable instructions for defining the modified set of routing paths such that at least one of the routing paths in the modified set of routing paths is longer than the corresponding routing path in the first set of routing paths.

17. The computer-readable medium of claim 14, having stored thereon computer-executable instructions for defining circuit routing paths between electronic components on a printed circuit board.

\* \* \* \* \*